United States Patent
Zhou

(10) Patent No.: US 10,446,463 B2
(45) Date of Patent: Oct. 15, 2019

(54) SEMICONDUCTOR STRUCTURES AND FABRICATION METHODS THEREOF

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/115,151

(22) Filed: Aug. 28, 2018

(65) Prior Publication Data
US 2019/0067155 A1 Feb. 28, 2019

(30) Foreign Application Priority Data
Aug. 31, 2017 (CN) .......................... 2017 1 0776635

(51) Int. Cl.
*H01L 29/66* (2006.01)
*H01L 23/367* (2006.01)
*H01L 23/373* (2006.01)
*H01L 29/06* (2006.01)
*H01L 29/78* (2006.01)

(52) U.S. Cl.
CPC ........ *H01L 23/367* (2013.01); *H01L 23/3738* (2013.01); *H01L 29/0649* (2013.01); *H01L 29/66795* (2013.01); *H01L 29/785* (2013.01); *H01L 29/66545* (2013.01)

(58) Field of Classification Search
CPC ................................................ H01L 29/66795
See application file for complete search history.

(56) References Cited

U.S. PATENT DOCUMENTS

2019/0051806 A1\* 2/2019 Phoa ....................... H01L 27/16

\* cited by examiner

*Primary Examiner* — Thomas L Dickey
(74) *Attorney, Agent, or Firm* — Anova Law Group, PLLC

(57) ABSTRACT

A semiconductor structure includes a substrate. The substrate includes a plurality of function regions and a plurality of heat-dissipation regions. Each heat-dissipation region is adjacent to at least one function region. The semiconductor structure also includes a plurality of active fin structures, protruding from the substrate of the plurality of function regions; a plurality of channel layers, each formed on an active fin structure; and a plurality of heat-dissipation fin structures, protruding from the substrate of the plurality of heat-dissipation regions.

20 Claims, 7 Drawing Sheets

SEMICONDUCTOR STRUCTURES AND FABRICATION METHODS THEREOF

CROSS-REFERENCES TO RELATED APPLICATIONS

This application claims the priority of Chinese Patent Application No. CN201710776635.4, filed on Aug. 31, 2017, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

With the rapid development of semiconductor manufacturing technology, semiconductor devices are developed towards a direction of having a higher component density and a higher integration degree. As the most fundamental semiconductor devices, transistors have been widely used. With the improvement of the component density and the integration degree, the gate size of planar transistors also becomes smaller and smaller, the ability of traditional planar transistors in controlling the channel current is weakened, resulting in the short channel effect (SCE) and causing leakage current. As such, the electrical performance of the semiconductor devices may be degraded.

According to existing technology, in order to overcome the SCE in transistors and suppress the leakage current, a fin field-effect transistor (Fin-FET) has been adopted. A Fin-FET is a common multi-gate device, which includes a fin structure formed on the surface of a semiconductor substrate, and a dielectric layer formed on the semiconductor substrate. With a top surface lower than the top surface of the fin structure, the dielectric layer covers a portion of the sidewall surfaces of the fin structure. The Fin-FET also includes a gate structure formed on the surface of the dielectric layer and a portion of the top and sidewall surfaces of the fin structure, and a source region and a drain region formed in the fin structure on the two sides of the gate structure, respectively.

According to existing technology, a substitution material is usually used to form the fin structure in the Fin-FET to improve the mobility of the carriers in the channel and the drive current of the transistor, and thus improve the performance of the semiconductor structure.

However, for semiconductor structures having a fin structure formed using a substitution material according to existing technology, the self-heating issue may be severe. Therefore, the performance of the formed semiconductor structures may be degraded. The disclosed semiconductor structures and fabrication methods thereof are directed to solve one or more problems set forth above and other problems in the art.

BRIEF SUMMARY OF THE DISCLOSURE

One aspect of the present disclosure provides a semiconductor structure. The semiconductor structure includes a substrate. The substrate includes a plurality of function regions and a plurality of heat-dissipation regions. Each heat-dissipation region is adjacent to at least one function region. The semiconductor structure also includes a plurality of active fin structures, protruding from the substrate of the plurality of function regions; a plurality of channel layers, each formed on an active fin structure; and a plurality of heat-dissipation fin structures, protruding from the substrate of the plurality of heat-dissipation regions.

Another aspect of the present disclosure provides a method for fabricating a semiconductor structure. The method includes providing a substrate, including a plurality of function regions and a plurality of heat-dissipation regions. Each heat-dissipation region is adjacent to at least one function region. The method further includes forming a plurality of active fin structures protruding from the substrate of the plurality of function regions, and a plurality of heat-dissipation fin structures protruding from the substrate of the plurality of heat-dissipation regions; and forming a dielectric layer on the substrate. The dielectric layer exposes the plurality of the active fin structures. The method also includes removing a portion of each active fin structure to form a plurality of fin-structure openings in the dielectric layer; and forming a plurality of channel layers in the plurality of fin-structure openings on top of a remaining portion of the plurality of active fin structures.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
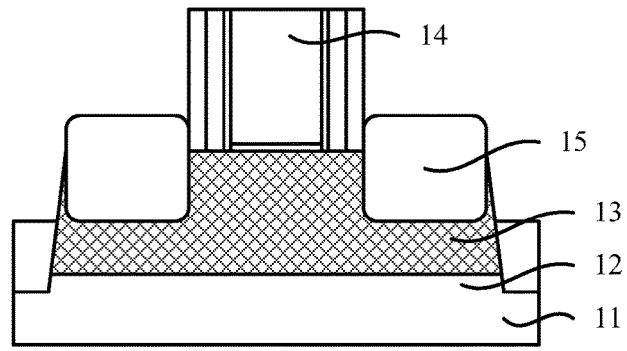
FIG. 1 illustrates a schematic cross-section view of a semiconductor structure.

FIG. 1 illustrates a schematic cross-section view of a semiconductor structure. The semiconductor structure includes a substrate 11, a fin structure 12 protruding from the surface of the substrate 11, a channel layer 13 formed on the fin structure 12, a gate structure 14 formed across the channel layer 13 and covering a portion of the top and sidewall surfaces of the channel layer 13, a stress layer 15 formed in the channel layer 13 on both sides of the gate structure 14.

According to the semiconductor structure, the gate structure 14 covers a portion of the top and the sidewall surfaces of the channel layer 13, and the stress layer 15 used to form a source/drain doped region is formed in the channel layer 13. Therefore, the channel of the semiconductor structure is located in the channel layer 13 under the gate structure 14.

When the semiconductor structure is a P-type metal-oxide-semiconductor (PMOS) transistor, in order to improve the mobility of carriers in the channel located in the channel layer 13, the channel layer 13 is usually made of SiGe. When the semiconductor structure is an N-type metal-oxide-semiconductor (NMOS) transistor, in order to improve the mobility of carriers in the channel located in the channel layer 13, the channel layer 13 is usually made of a Group III-V semiconductor material, such as InGaAs, InAs, etc.

Compared to the structures of covalence bonds in Si, the structures of covalence bonds in SiGe and the Group III-V semiconductor materials are relatively weak, the thermal conductivity of SiGe and the Group III-V semiconductor materials is relatively small. The small thermal conductivity may cause heat dissipation problems in the semiconductor structure, and the heat in the channel layer 13 under the gate structure 14 may not be effectively dissipated.

Figure 2:
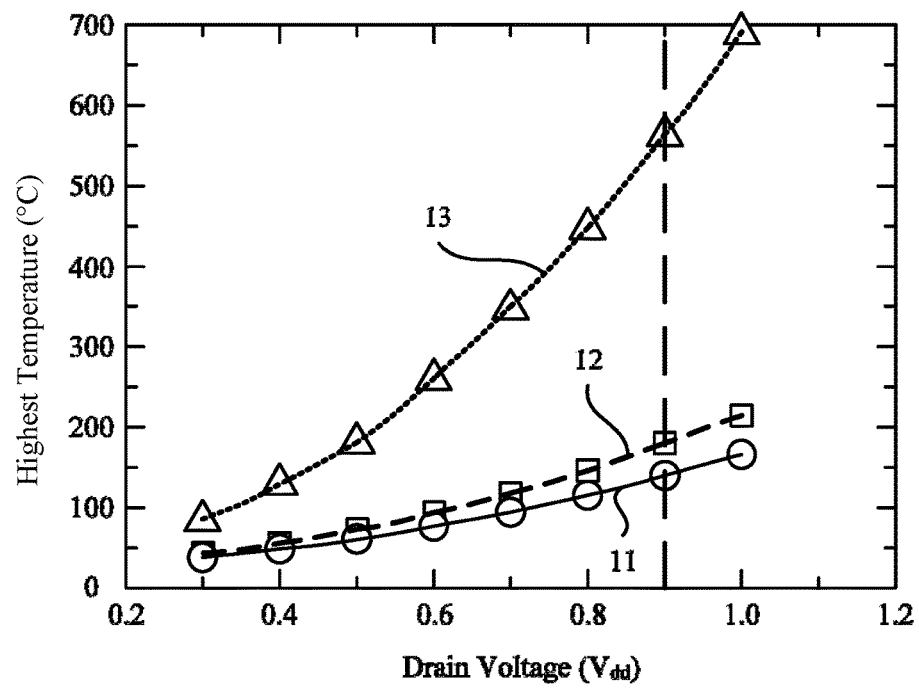
FIG. 2 illustrates a schematic diagram of the relation between the highest temperature and the drive voltage of a device.

FIG. 2 illustrates a schematic diagram of the relation between the highest temperature and the drive voltage of a device.

Referring to FIG. 2, the horizontal axis represents drain voltage ($V_{dd}$) of a device, and the vertical axis represents the highest temperature of the device. Moreover, curve 11 represents the relation between the highest temperature and the drain voltage of a Si device (i.e., a semiconductor structure having a channel layer made of Si); curve 12 represents the relation between the highest temperature and the drain voltage of a Ge device (i.e., a semiconductor structure having a channel layer made of Ge); curve 13 represents the relation between the highest temperature and the drain voltage of a Group III-V semiconductor device (i.e., a semiconductor structure having a channel layer made of a Group III-V semiconductor, for example, InAs).

Referring to FIG. 2, when an identical drain voltage is applied, the highest temperature of the Si device represented by curve 11 is the smallest, the highest temperature of the Ge device represented by curve 12 is the higher than the highest temperature of the Si device, but lower than the highest temperature of the Group III-V semiconductor device, which is represented by curve 13. The highest temperature of the Group III-V semiconductor device represented by curve 13 is not only the highest, but far higher than the highest temperatures of the Si device and the Ge device.

That is, when the channel layer is made of SiGe or a Group III-V semiconductor material instead of Si, the ability of the semiconductor structure for dissipating the heat in the channel layer may be degraded, resulting in a severe self-heating issue. Therefore, the performance of the semiconductor structure may be degraded.

Figure 13:
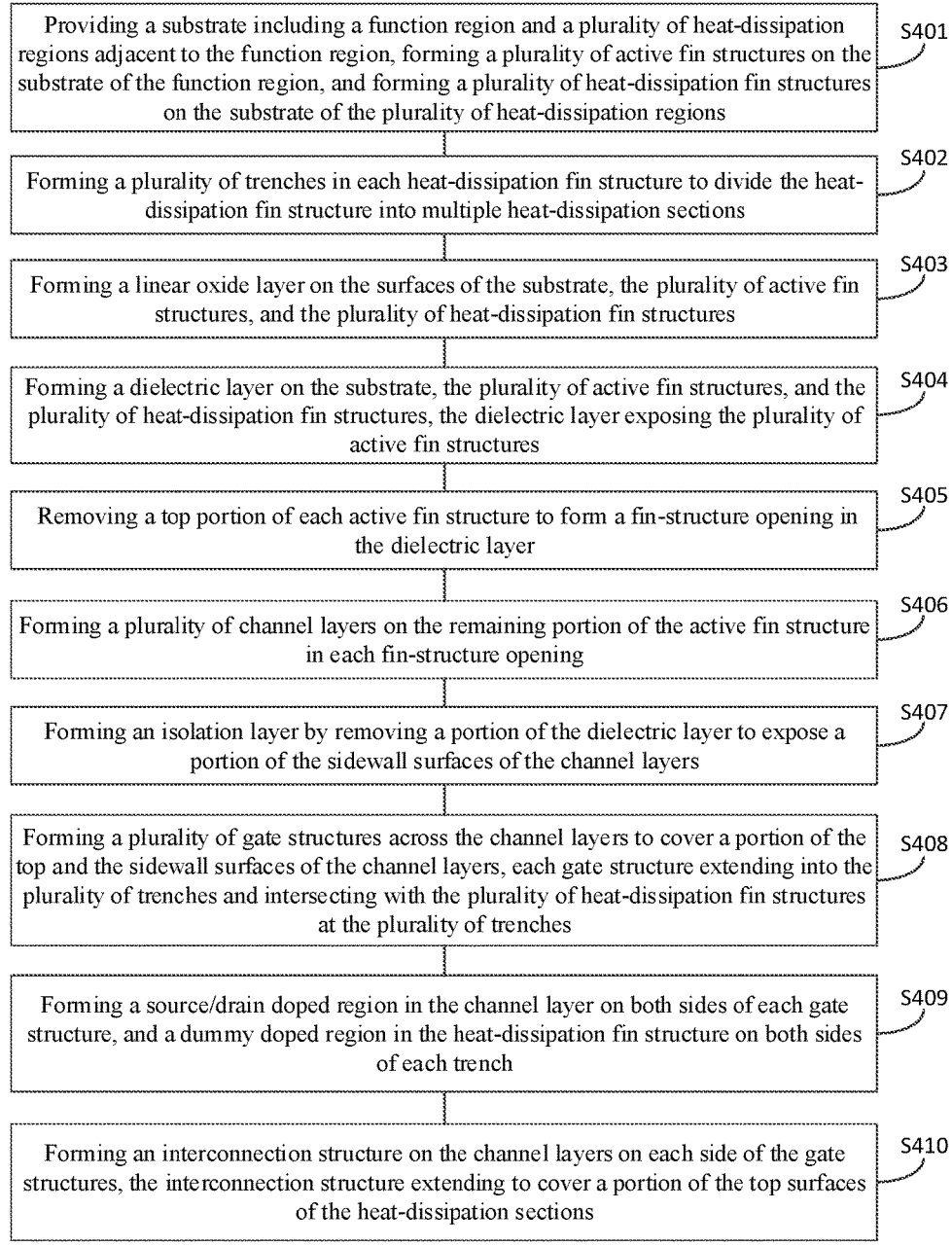
FIG. 13 illustrates a flowchart of an exemplary method for fabricating a semiconductor device consistent with various embodiments of the present disclosure.

The present disclosure provides a method for fabricating a semiconductor structure. FIG. 13 illustrates a flowchart of an exemplary method for fabricating a semiconductor device consistent with various embodiments of the present disclosure. FIGS. 3-10 illustrate schematic cross-section views of semiconductor structures at certain stages of the exemplary method.

Figure 3:
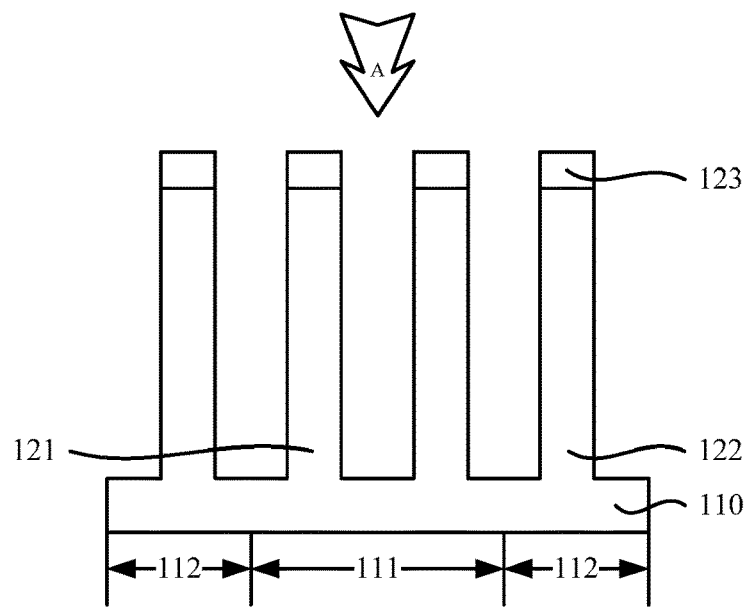
FIGS. 3-10 illustrate schematic views of semiconductor structures at certain stages of an exemplary method for fabricating a semiconductor structure consistent with some embodiments of the present disclosure.

Referring to FIG. 13, a substrate including a function region and a plurality of heat-dissipation regions adjacent to the function region may be provided, a plurality of active fin structures may be formed on the substrate of the function region, and a plurality of heat-dissipation fin structures may be formed on the substrate of the plurality of heat-dissipation regions (S401). FIG. 3 illustrates a schematic cross-section view of a semiconductor structure consistent with some embodiments of the present disclosure.

Referring to FIG. 3, a substrate 110 including a function region 111 and a plurality of heat-dissipation regions 112 adjacent to the function region 111 may be provided, a plurality of active fin structures 121 may be formed on the substrate 110 of the function region 111, and a plurality of heat-dissipation fin structures 122 may be formed on the substrate 110 of the plurality of heat-dissipation regions 112.

The substrate 110 may be used to provide a process platform for subsequent processes, and may also provide mechanic support for the semiconductor structure.

The substrate 110 of the function region 111 may be used for forming a plurality of transistors such that the electrical performance of the formed semiconductor structure may be realized by the plurality of transistors formed on the substrate 110 in the function region 111. The substrate 110 of the plurality of heat-dissipation regions 112 may be used for forming the plurality of heat-dissipation fin structures 122 such that the heat-dissipation ability of the formed semiconductor structure may be improved. Therefore, the performance of the semiconductor structure may also be improved.

The substrate 110 of the function region 111 and the substrate 110 of the plurality of heat-dissipation regions 112 may be connected to each other. As such, when the plurality of semiconductor structures formed on the substrate 110 of the function region 111 operate, the heat generated in the function region 111 may be transferred from the substrate 110 of the function region 111 to the substrate of the plurality of heat-dissipation regions 112, and thus may be dissipated.

In one embodiment, the number of the heat-dissipation regions 112 may be more than one, and the heat-dissipation regions 112 may be disposed on the two sides of the function region 111. Therefore, the heat generated in the function region 111 may be dissipated through the heat-dissipation regions 112. As such, the heat-dissipation ability of the formed semiconductor structure may be improved.

In one embodiment, the substrate 110 may be made of Si. The thermal conductivity of Si is large. In particular, Si—Si bond structures in single-crystalline Si are strong covalent bond structures that have high efficiency in conducting particle vibrations. Therefore, the thermal conductivity of single-crystalline Si is high. Using Si as the material for forming the substrate 110 may be able to effectively improve the heat conduction result of the substrate 110, and thus may be conducive to improving the result of heat dissipation. As such, the performance of the formed semiconductor structure may be improved.

In other embodiments, the substrate may be made of polycrystalline silicon, amorphous silicon, germanium, GaAs, SiGe, or any other appropriate semiconductor material. Alternatively, the substrate may be a structure including an epitaxial layer or may be made of silicon on insulator. The substrate may be made of a semiconductor material having high thermal conductivity.

The plurality of active fin structures 121 may be used to provide support for a plurality of subsequently-formed channel layers, and may also be used to conduct the heat generated by the plurality of semiconductor structures formed on the active fin structures 121. In addition, because a portion of each active fin structure 121 may be removed in a subsequent process to form a channel layer, the plurality of active fin structures 121 may also be used to occupy a space for the subsequently-formed channel layers. The plurality of heat-dissipation fin structures 122 may be used to realize the dissipation of the heat conducted through the substrate 110 of the heat-dissipation regions 112.

The plurality of active fin structures 121 may be connected to the plurality of channel layers formed in a subsequent process. When the formed semiconductor structure operates, the active fin structures 121 may be able to conduct the heat generated in the channel layers. In one embodiment, the plurality of active fin structures 121 may also be connected to the substrate 110 of the function region 111 such that the heat generated in the channel layers may be conducted to the substrate 110 of the function region 111, and then to the substrate 110 of the heat-dissipation regions 112. Further, the plurality of heat-dissipation fin structures 122 may be connected to the substrate 110 of the heat-dissipation regions 112, and thus may be able to conduct the heat in the substrate 110 of the heat-dissipation regions 112 to realize heat dissipation. Therefore, the formation of the plurality of heat-dissipation fin structures 122 may be able to effectively improve the dissipation of the heat generated in the channel layers, and thus may be conducive to improving the performance of the formed semiconductor structure.

Figure 4:
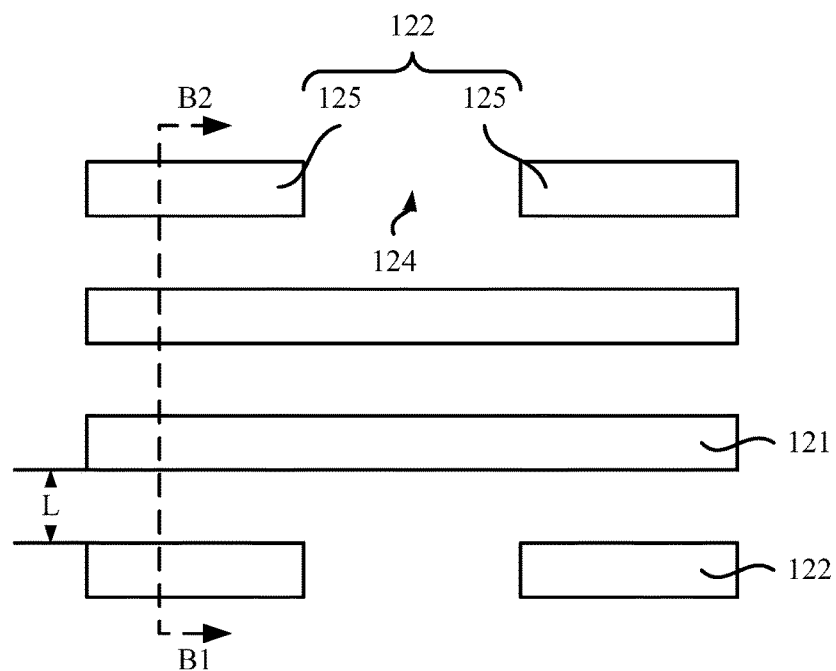

FIG. 4 illustrates a schematic top view of the semiconductor structure in an A direction shown in FIG. 3. For illustrative purposes, the substrate 110 is not included in the top view shown in FIG. 4.

Referring to FIGS. 3-4, in the length direction of the plurality of active fin structures 121, the heat-dissipation regions 112 may be disposed on at least one side of the function region 111. In addition, the plurality of heat-dissipation fin structures 122 may be arranged in parallel to the plurality of active fin structures 121. That is, the length direction of the heat-dissipation fin structures 122 may be parallel to the length direction of the active fin structures 121. By arranging the plurality of heat-dissipation fin structures 122 in parallel to the plurality of active fin structures 121, the process difficulty for forming the plurality of heat-dissipation fin structures 122 and the plurality of active fin structures 121 may be reduced. Therefore, undesired effects in the fabrication process may be effectively reduced, and thus the performance may be improved and the production yield may also be improved.

In one embodiment, the distance L between a heat-dissipation fin structure 122 and an adjacent active fin structure 121 may be in a range of approximately 40 nm to 90 nm. That is, at the boundary between the function region 111 and the adjacent heat-dissipation region 112, the distance between the heat-dissipation fin structure 122 close to the function region 111 and the active fin structure 121 close to the heat-dissipation region 112 may be in a range of approximately 40 nm to 90 nm.

At the boundary between the function region 111 and the adjacent heat-dissipation region 112, the distance L between a heat-dissipation fin structure 122 and an adjacent active fin structure 121 may not be too large or too small. When the distance L between the heat-dissipation fin structure 122 and the adjacent active fin structure 121 is too large, the heat conduction to the heat-dissipation fin structure 122 may be affected, which may not be conducive to heat dissipation. In addition, a large distance L between the heat-dissipation fin structure 122 and the adjacent active fin structure 121 may also increase the wafer area that is occupied by the formed semiconductor structure, which may not be conducive to improving the integration level. When the distance L between the heat-dissipation fin structure 122 and the adjacent active fin structure 121 is too small, the small distance between the heat-dissipation fin structure 122 and the active fin structure may not be conducive to the dissipation of heat at the active fin structure 121, and thus may not be conducive to improving the performance of the formed semiconductor structure.

In one embodiment, two active fin structures 121 are formed on the substrate 110 of the function region 111, and the two active fin structures 121 are parallel to each other. In addition, the semiconductor structure includes two heat-dissipation regions 112, and in a direction perpendicular to the length direction of the active fin structures 121, the two heat-dissipation regions 112 are located at the two sides of the function region 111, respectively. Further, a heat-dissipation fin structure 122 is formed on the substrate 110 of each heat-dissipation region 112.

In other embodiments, the number of the heat-dissipation fin structures formed on each heat-dissipation region may be more than one, and the formed heat-dissipation fin structures may be parallel to each other. The distance between adjacent heat-dissipation fin structures may be in a range of approximately 30 nm to 100 nm.

The distance between adjacent heat-dissipation fin structures 122 may not be too large or too small. When the distance between adjacent heat-dissipation fin structures 122 is too large, an increase in the area of the heat-dissipation region 112 may not be avoided, and thus, the wafer area that is occupied by the formed semiconductor structure may be too large. As such, the integration level of the semiconductor structure may be affected. When the distance between adjacent heat-dissipation fin structures 122 is too small, the dissipation of the heat at the heat-dissipation fin structures 122 may be affected, which may not be conducive to improving the heat dissipation effect of the heat-dissipation fin structures 122. Therefore, the performance of the formed semiconductor structure may not be improved.

In other embodiments, the number of the heat-dissipation fin structures 122 may be smaller than or equal to the number of the active fin structures 121 such that the wafer area that is occupied by the heat-dissipation fin structures 122 may be reduced. Therefore, the area of the heat-dissipation region may be reduced, and the area occupied by the formed semiconductor structure may be limited, such that the integration level may be improved.

In one embodiment, the active fin structures 121 and the heat-dissipation fin structures 122 may be made of a material the same as the material of the substrate 110. For example, the active fin structures 121, the heat-dissipation fin structures 122, and the substrate 110 may all be made of Si. The thermal conductivity of Si is high, and using Si for forming the active fin structures 121 and the heat-dissipation fin structures 122 may be able to effectively improve the conduction of heat, and thus may be conducive to improving the heat dissipation result. As such, the performance of the formed semiconductor structure may be improved.

In one embodiment, the substrate 110, the active fin structures 121, and the heat-dissipation fin structures 122 may be formed simultaneously. For example, the process for forming the substrate 110 may include the following steps. A base substrate, including a substrate and a fin-structure material layer formed on the substrate, may be provided. A fin-structure mask layer 123 may be formed on the fin-structure material layer, and the fin-structure mask layer 123 may define the positions and the dimensions of the active fin structures 121 and the heat dissipation fin structures 122. The fin-structure material layer may then be etched using the fin-structure mask layer 123 as an etch mask to form the active fin structures 121 protruding from the substrate 110 of the function region 111 and the heat-dissipation fin structures 122 protruding from the substrate 110 of the heat-dissipation region 112.

Because the active fin structures 121 and the heat-dissipation fin structures 122 are all formed from the base substrate through etching, the formed active fin structures 121, the formed heat-dissipation fin structures 122, and the substrate 110 may together form a single-piece structure. That is, there is no clearly-defined boundary separating the active fin structures 121, the heat-dissipation fin structures 122, and the substrate 110. Without any obvious boundary separating the active fin structures 121, the heat-dissipation fin structures 122, and the substrate 110, the efficiency for heat transfer from the active fin structures 121 to the heat-dissipation fin structures 122 through the substrate 110 may be effectively improved. Therefore, the heat-dissipation ability may be effectively improved and the performance of the formed semiconductor structure may also be improved.

In one embodiment, after forming the active fin structures 121 and the heat-dissipation fin structures 122, the fin-structure mask layer 123 may be retained. In subsequent fabrication processes, the fin-structure mask layer 123 may be used to indicate a stop position when performing a planarization process. In addition, the fin-structure mask layer 123 may also cover the top surfaces of the active fin structures 121 and the heat-dissipation fin structures 122, and thus provide protection for the active fin structures 121 and the heat-dissipation fin structures 122.

Further, returning to FIG. 13, after forming the plurality of heat-dissipation fin structures and the plurality of active fin structures, a plurality of trenches may be formed in each heat-dissipation fin structure to divide the heat-dissipation fin structure into multiple heat-dissipation sections (S402). The schematic top view of the semiconductor structure shown in FIG. 4 illustrates the formation of the plurality of trenches in the heat-dissipation fin structures.

Referring to FIG. 4, after forming the plurality of heat-dissipation fin structures 122 and the plurality of active fin structures 121, a plurality of trenches 124 may be formed in each heat-dissipation fin structure 122 through etching. The plurality of trenches 124 may divide each of the heat-dissipation fin structure 122 into multiple heat-dissipation sections 125 lined up in the length direction of the heat-dissipation fin structure 122.

The plurality of trenches 124 may be used to provide a process space for forming a plurality of gate structures in a subsequent process. As such, each gate structure may be able to extend through the heat-dissipation fin structures 122 without forming a channel in the heat-dissipation fin structure 122. Therefore, the influence of the heat-dissipation fin structures 122 on the formed semiconductor structure may be reduced. The arrangement of the plurality of trenches 124 may be able to effectively reduce the influence of the heat-dissipation fin structures 122 on the electrical performance of the semiconductor structure, conducive to improving the stability and reliability of the formed semiconductor structure.

In one embodiment, the process for forming the plurality of trenches 124 may include the following exemplary steps. A trench mask layer (not shown) may be formed on the plurality of heat-dissipation fin structures 122. The plurality of trenches 214 may be formed by etching the heat-dissipation fin structures 122 using the trench mask layer as an etch mask.

The trench mask layer may be used to define the positions and the dimensions of the plurality of trenches 124. A plurality of etched openings may be formed in the trench mask layer to expose a portion of the heat-dissipation fin structures 122. The positions of the plurality of etched openings may correspond to the positions of the subsequently-formed gate structures. The trench mask layer may be a patterned photoresist layer, or a patterned hard mask layer.

In one embodiment, the plurality of heat-dissipation fin structures 122 may be etched by an anisotropic dry etching process.

Figure 5:
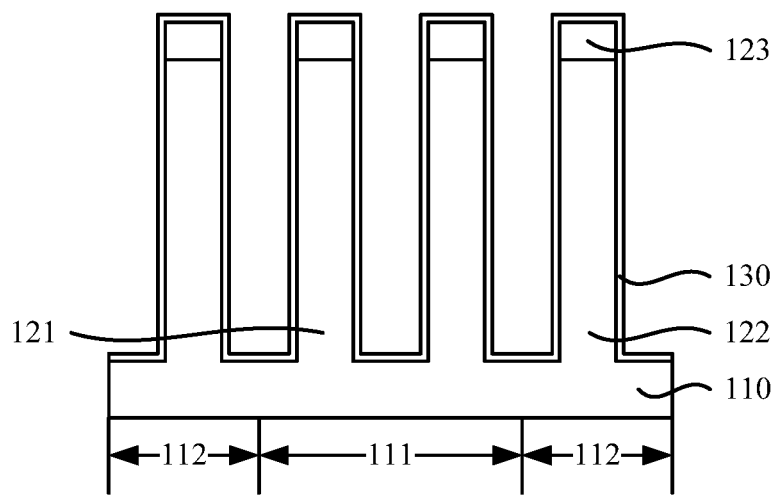

Further, returning to FIG. 13, after forming the plurality of trenches, a linear oxide layer may be formed on the surfaces of the substrate, the plurality of active fin structures, and the plurality of heat-dissipation fin structures (S403). FIG. 5 illustrates a schematic cross-section view of a semiconductor structure consistent with some embodiments of the present disclosure. The schematic structural view shown in FIG. 5 is the cross-section view of a semiconductor structure process from the structure shown in FIG. 4 in a B1B2 direction.

Referring to FIG. 5, after forming the plurality of trenches 124 (referring to FIG. 4), a linear oxide layer 130 may be formed on the surfaces of the substrate 110, the active fin structures 121, and the heat-dissipation fin structures 122.

The linear oxide layer 130 may be able to repair the surface damage of the substrate 110, the active fin structures 121, and the heat-dissipation fin structures 122. In addition, the linear oxide layer 130 may also be able to smooth the sharp corners at the surfaces of the substrate 110, the active fin structures 121, and the heat-dissipation fin structures 122, and may also serve as a buffer layer between subsequently-formed film layers and the substrate 110, the active fin structures 121, and the heat-dissipation fin structures 122 to reduce lattice mismatch.

In one embodiment, the linear oxide layer 130 may be formed by a chemical vapor deposition (CVD) process, or a thermal oxidation process. In other embodiments, the linear oxide layer may not need to be formed, and the damages may be repaired through an annealing process.

Figure 6:
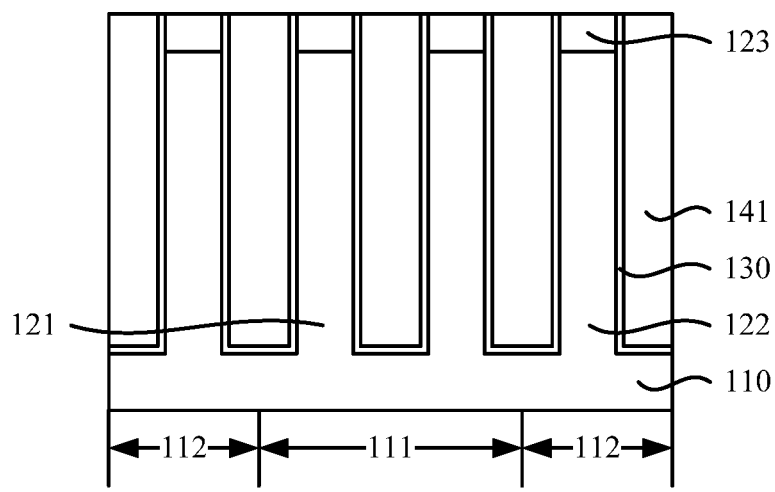

Further, returning to FIG. 13, a dielectric layer exposing the plurality of active fin structures may be formed on the substrate (S404). FIG. 6 illustrates a schematic cross-section view of a semiconductor structure consistent with some embodiments of the present disclosure.

Referring to FIG. 6, a dielectric layer 141 may be formed on the substrate 110. The dielectric layer 141 may expose the plurality of active fin structures 121.

The dielectric layer 141 may be used to form an isolation layer to fill up the space between the plurality of active fin structures 121 and the plurality of heat-dissipation fin structures 122 and to electrically isolate the plurality of active fin structures 121 and the plurality of heat-dissipation fin structures 122. In addition, the dielectric layer may also expose the top surfaces of the plurality of active fin structures 121. Therefore, the dielectric layer 141 may also be used to define the dimensions and the positions of the channel layers formed in a subsequent process.

In one embodiment, a fin-structure mask layer 123 is formed on the plurality of active fin structures 121 and the plurality of heat-dissipation fin structures 122, and accordingly, the top surface of the dielectric layer 141 may be leveled with the top surface of the fin-structure mask layer 123.

In one embodiment, the dielectric layer 141 may be made of $SiO_x$. In other embodiments, the dielectric layer may be made of one or more of $SiN_x$, SiON, a low-k dielectric material (i.e., a material with a dielectric constant larger than or equal to 2.5, but smaller than 3.9), and an ultra-low-k dielectric material (i.e., a material with a dielectric constant smaller than 2.5).

In one embodiment, the dielectric layer 141 may be formed by a process including the following exemplary steps. A dielectric material layer may be formed on the portion of the substrate 110 exposed by the plurality of active fin structures 121 and the plurality of heat-dissipation fin structures 122. The dielectric material layer may cover the fin-structure mask layer 123. A planarization process may be performed on the dielectric material layer to remove the portion of the dielectric material layer formed above the surface of the fin-structure mask layer 123 until the fin-structure mask layer 123 is exposed. As such, the dielectric layer may be formed.

In one embodiment, the dielectric material layer may be formed by a CVD process (such as fluid chemical vapor deposition process, etc.), and the planarization process may be a chemical mechanical polishing (CMP) process.

Figure 7:
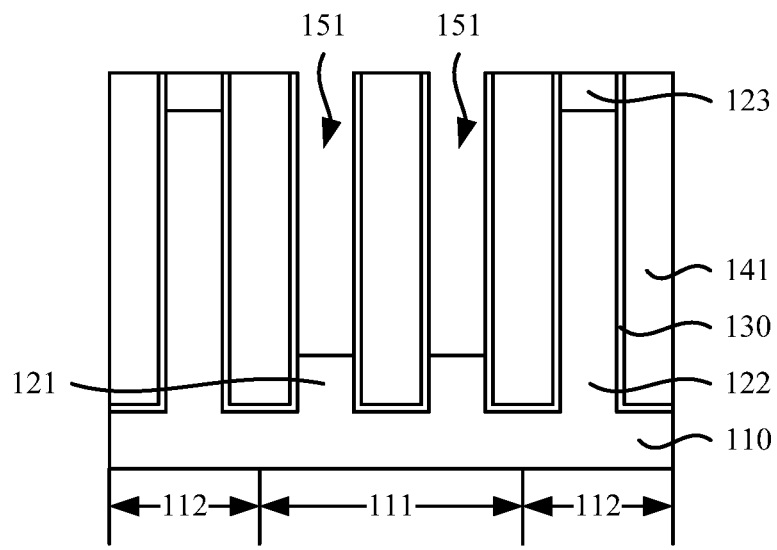

Further, returning to FIG. 13, a top portion of each active fin structure may be removed to form a fin-structure opening in the dielectric layer (S405). FIG. 7 illustrates a schematic cross-section view of a semiconductor structure consistent with some embodiments of the present disclosure.

Referring to FIG. 7, a top portion of each active fin structure 121 may be removed to form a fin-structure opening 151 in the dielectric layer 141.

The fin-structure opening 151 may be used to provide a process space for forming a plurality of channel layers in a subsequent process. In one embodiment, a fin-structure mask layer 123 is formed on the active fin structure 121, and thus removing the top portion of the active fin structure 121 may include the following exemplary steps. The portion of the fin-structure mask layer 123 formed on each active fin structure 121 may be removed to expose the top surface of the active fin structure 121. Further, a top portion of the active fin structure 121 may be removed.

In one embodiment, the active fin structure 121 may be made of Si, and accordingly, the top portion of the active fin structure 121 may be removed through a wet etching process. For example, the process parameters used in the wet etching process for removing the top portion of the active fin structure 121 may include an etch solution including $H_3PO_4$, and an etch temperature in a range of approximately 90° C. to 150° C.

In one embodiment, the ratio of the height of the removed portion of the active fin structure to the total height of the active fin structure 121 may be in a range of approximately 1:3 to 1:1.

The ratio of the height of the removed portion of the active fin structure to the total height of the active fin structure 121 may not be too large or too small. When the ratio of the height of the removed portion of the active fin structure to the total height of the active fin structure 121 is too small, the thickness of the channel layers formed in the fin-structure opening 151 in a subsequent process may be too small, which may affect the performance of the subsequently-formed channel of the semiconductor structure. When the ratio of the height of the removed portion of the active fin structure to the total height of the active fin structure 121 is too large, that is, the height of the removed portion of the active fin structure 121 is too large, material waste may be caused, and the process difficulty may be increased.

In one embodiment, the height of the removed portion of the active fin structure 121 may be in a range of approximately 500 Å to 1000 Å. That is, the depth of the fin-structure opening 151 may be in a range of approximately 500 Å to 1000 Å.

Figure 8:
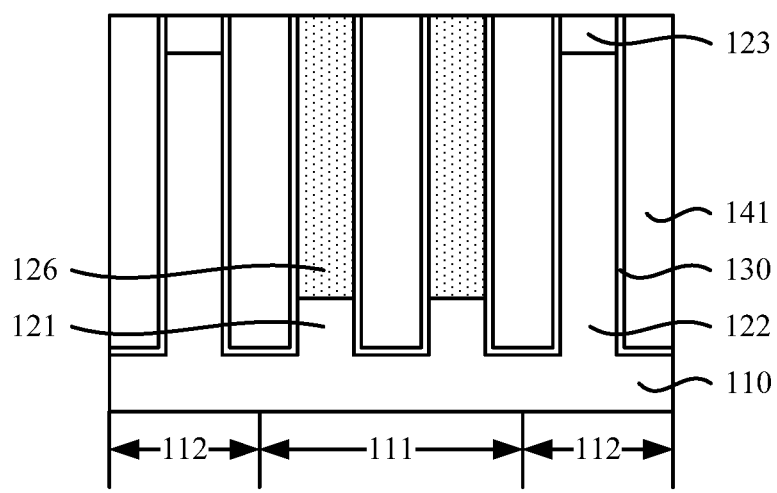

Further, returning to FIG. 13, a plurality of channel layers may be formed on the remaining portion of the active fin structure in each fin-structure opening (S406). FIG. 8 illustrates a schematic cross-section view of a semiconductor structure consistent with some embodiments of the present disclosure.

Referring to FIG. 8, a plurality of channel layers 126 may be formed in each fin-structure opening 151 (referring to FIG. 7) on the remaining portion of the active fin structure 121. A channel of the subsequently-formed semiconductor structure may be located in each channel layer 126.

The channel layer 126 may fill up the fin-structure opening 151. In one embodiment, the top surface of the dielectric layer is leveled with the top surface of the fin-structure mask layer 123, and thus the top surface of the channel layer 126 may also be leveled with the top surface of the fin-structure mask layer 123.

In one embodiment, the semiconductor structure to be formed may be an NMOS transistor device, and thus, the plurality of channel layers 126 may be made of a Group III-V semiconductor. For example, the plurality of channel layers 126 may be made of InGaAs or InAs. In other embodiments, the semiconductor structure to be formed may be a PMOS transistor device, and thus, the plurality of channel layers may be made of SiGe.

Using a Group III-V semiconductor to form the plurality of channel layers 126 may be able to effectively improve the properties of the channels, and thus may be conducive to improving the performance of the semiconductor structure. In addition, because the plurality of channel layers 126 are formed on the active fin structure 121, when the formed semiconductor structure operates, the heat generated in the plurality of channel layers 126 may be transferred to the substrate 110 through the active fin structure 121, and may thus be transferred to the plurality of heat-dissipation fin structures 122 through the substrate 110. As such, the heat generated in the channel layers 126 may be dissipated. Therefore, the plurality of heat-dissipation fin structures 122 and the connected substrate 110 may be able to effectively improve the heat-dissipation ability of the channel layers 126, which may benefit both the channel performance and the heat dissipation capability, and thus may be conducive to improving the performance of the formed semiconductor structure.

In one embodiment, the plurality of channel layers 126 may be formed by filling the fin-structure opening 151 (referring to FIG. 7) with the Group III-V semiconductor material through an epitaxial growth method. By using the epitaxial growth method to form the plurality of channel layers 126, the quality of the formed channel layers 126 may be improved, and the desired performance of the channel of the formed semiconductor structure may thus be ensured.

In one embodiment, during the process for forming the plurality of channel layers 126, the portion of the fin-structure mask layer 123 formed on the top surfaces of the plurality of heat-dissipation fin structures 122 may be able to prevent the growth of the Group III-V semiconductor material on the heat-dissipation fin structures 122 such that the selective growth of the Group III-V semiconductor material may be achieved.

Figure 9:
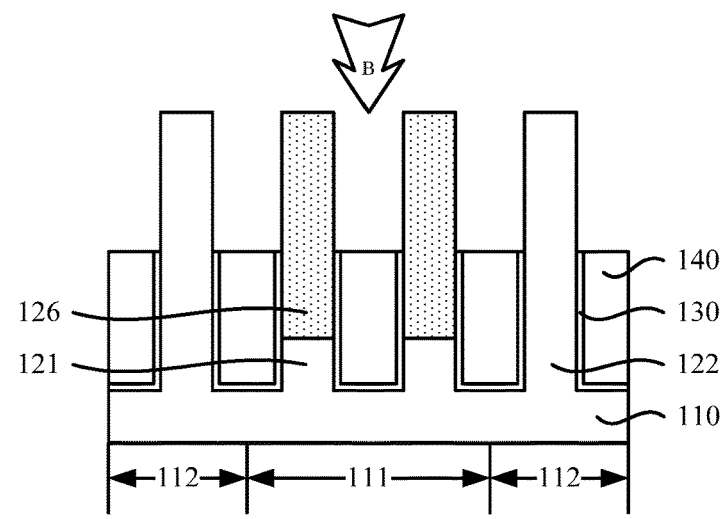

Further, returning to FIG. 13, an isolation layer may be formed by removing a portion of the dielectric layer to expose a portion of the sidewall surfaces of the channel layers (S407). FIG. 9 illustrates a schematic cross-section view of a semiconductor structure consistent with some embodiments of the present disclosure.

Referring to FIG. 9, after forming the plurality of channel layers 126, a portion of the dielectric layer 141 (referring to FIG. 8) may be removed to expose a portion of the sidewall surfaces of the channel layers 126. The remaining portion of the dielectric layer 141 may form an isolation layer 140.

In one embodiment, the process of removing the portion of the dielectric layer 141 may be used to form the isolation layer 140. The isolation layer may expose a portion of the sidewall surfaces of the channel layers 126 such that may provide a process basis for forming a plurality of gate structures 150 to cover a portion of the sidewall surfaces of each channel layer 126 in a subsequent process.

Further, after removing the portion of the dielectric layer 141, the isolation layer 140 formed by the remaining portion of the dielectric layer 141 may fill up the space between the plurality of heat-dissipation fin structures 122 and the plurality of active fin structures 121. Therefore, the isolation layer 140 may electrically isolate the plurality of active fin structures 121 and the plurality of heat-dissipation fin structures 122.

In one embodiment, the dielectric layer 141 may fill up the space between the plurality of heat-dissipation fin structures 122 and the plurality of active fin structures 121, and the top surface of the channel layer 126 may be leveled with the top surface of the fin-structure mask layer 123. Therefore, after removing the portion of the dielectric layer 141, the top surface of the formed isolation layer 140 may be lower than the top surface of the channel layer 126. As such, the isolation layer 140 may not only expose a portion of the sidewall surfaces of each channel layer 126, but also expose a portion of the sidewall surfaces of each heat-dissipation fin structure 122.

In one embodiment, the process for removing the portion of the dielectric layer 141 to form the isolation layer 140 may include the following exemplary steps. An etching back process may be performed to remove the portion of the dielectric layer 141 to form the isolation layer 140. During the etching back process, the portion of the fin-structure mask layer 123 formed on the top surfaces of the plurality of heat-dissipation fin structures 122 may be simultaneously removed to expose the top surfaces of plurality of the heat-dissipation fin structures 122.

Figure 10:
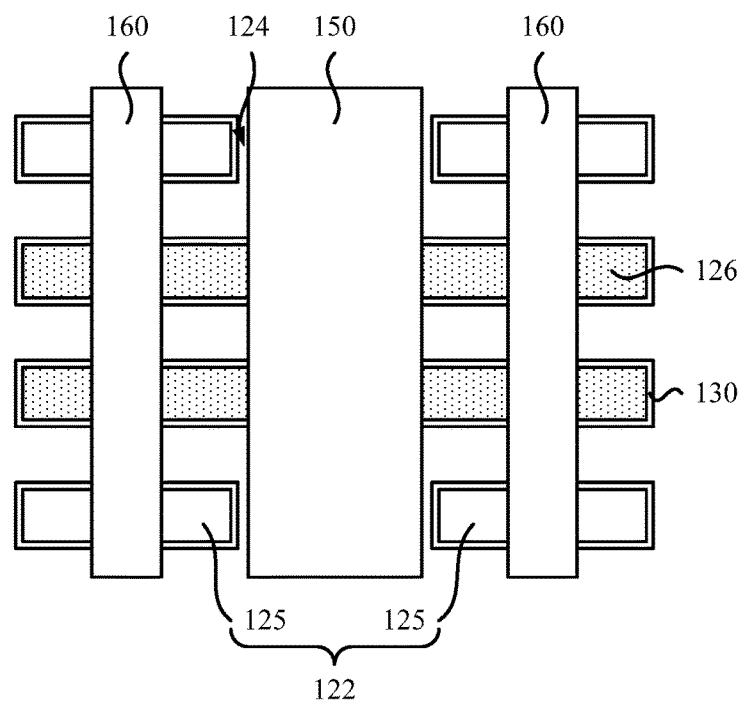

Further, returning to FIG. 13, a plurality of gate structures may be formed across the channel layers to cover a portion of the top and the sidewall surfaces of the channel layers, and each gate structure may extend into the plurality of trenches and intersect with the plurality of heat-dissipation fin structures at the plurality of trenches (S408). FIG. 10 illustrates a schematic top view of semiconductor structure consistent with some embodiments of the present disclosure. Specifically, FIG. 10 illustrates the top view of the semiconductor structure in a B direction shown in FIG. 9. For illustrative purposes, the substrate 110 and the isolation layer 140 are not included in the top view shown in FIG. 10.

Referring to FIG. 10, a plurality of gate structures 150 may be formed across the channel layers 126. The gate structure 150 may cover a portion of the top and the sidewall surfaces of each channel layer 126. Moreover, the gate structure 150 may extend into the plurality of trenches 124, and may intersect with the plurality of heat-dissipation fin structures 122 at the plurality of trenches 124.

Each gate structure 150 may serve as a gate structure for the semiconductor structure to be formed and may be used to control turning on or turning off the channel of the gate structure. The gate structure 150 may be formed across the channel layers 126 and may cover a portion of the top and the sidewall surfaces of each channel layer 126.

In one embodiment, the gate structure 150 may be a polycrystalline silicon gate structure. In other embodiments, the gate structure may be a metal gate structure.

In one embodiment, the plurality of gate structures 150 may be formed by a process including the following exemplary steps. A gate material layer may be formed on the substrate 110. A patterned gate mask layer may be formed on the gate material layer. Further, the plurality of gate structures may be formed by etching the gate material layer using the patterned gate mask layer as an etch mask.

As shown in FIG. 10, the extending direction of each gate structure 150 may be perpendicular to the channel layers 126, and the gate structure 150 may extend to intersect with the plurality of heat-dissipation fin structures 122. However, the intersections between the gate structure 150 and the plurality of heat-dissipation fin structure 122 may correspond to the positions of the plurality of trenches 124. That is, the gate structure 150 may extend into the plurality of trenches 124, and may intersect with the plurality of heat-dissipation fin structures 122 at the plurality of trenches 124. Accordingly, when the formed semiconductor structure operates, because the heat-dissipation fin structures 122 do not include any channel, the influence of the heat-dissipation fin structures 122 on the electrical performance of the formed semiconductor structure may be prevented.

Further, returning to FIG. 13, after forming the plurality of gate structures, a source/drain doped region may be formed in the channel layer on both sides of each gate structure, and a dummy doped region may be formed in the heat-dissipation fin structure on both sides of each trench (S409).

In one embodiment, after forming the plurality of gate structures 150, a source/drain doped region (not shown) may be formed in the channel layer 126 on both sides of each gate structure 150, and a dummy doped region (not shown) may be formed in the heat-dissipation fin structure 122 on both sides of each trench 124. Simultaneously forming the source/drain doped region and the dummy doped region may be able to avoid introducing more mask layers in the fabrication process. As such, without increasing the production cost, the heat dissipation ability of the formed semiconductor structure may be improved, and the performance of the formed semiconductor structure may thus be improved.

In one embodiment, in the course of forming the semiconductor structure, the source/drain doped region may be formed after forming the plurality of gate structures. That is, the semiconductor structure may be formed by a gate-first process. In other embodiments, semiconductor structure may be formed by a gate-last process.

For example, the gate-last process may include the following exemplary steps. After forming the plurality of channel layers, a plurality of dummy gate structures may be formed on the channel layers. Each dummy gate structure may be formed across the plurality of channel layers and may cover a portion of the top and the sidewall surfaces of each channel layer. The dummy gate structure may extend into the plurality of trenches and may intersect with the plurality of heat-dissipation fin structures at the plurality of trenches. A source/drain doped region may be formed in the channel layer on both sides of each dummy gate structure, and a dummy doped region may be formed in each heat-dissipation fin structure on both sides of each dummy gate structure. An interlayer dielectric layer may be formed on the substrate between the dummy gate structures. The interlayer dielectric layer may expose the top surface of each dummy gate structure. Further, each dummy gate structure may be removed to form a gate-structure opening, and then a gate structure may be formed in the gate-structure opening.

Further, returning to FIG. 13, after forming the plurality of gate structures, an interconnection structure may be formed on the channel layers on each side of the gate structures (S410). The semiconductor structure shown in FIG. 10 includes an interconnection structure formed on the channel layer on each side of the gate structures.

Moreover, referring to FIG. 10, after forming the plurality of gate structures 150, an interconnection structure 160 may be formed on the channel layers 126 on each side of the gate structures 150. The interconnection structure 160 may extend to cover a portion of the top surfaces of the heat-dissipation sections 125.

In one embodiment, a source/drain doped region may be formed in each channel layer 126 on both sides of the gate structure 150, and accordingly, the interconnection structure 160 may be formed on the source/drain doped region, and may electrically connect to the source/drain doped region. The interconnection structure 160 may be used to electrically connect the source/drain doped region to external circuits.

The interconnection structure 160 may be made of a conductive material, e.g. a metal. Therefore, the thermal conductivity of the material for forming the interconnection structure 160 may be large. As such, the interconnection structure 160 formed on the channel layers 126 on each side of the gate structures may be able to conduct heat such that the heat dissipation ability of the formed semiconductor structure may be improved.

As shown in FIG. 10, the extending direction of the interconnection structure 160 may be perpendicular to the extending direction of the active fin structures 121 and the channel layers 126. In addition, the interconnection structure 160 may extend to cover a portion of the top surfaces of the heat-dissipation sections 125. The interconnection structure 160 may not only directly dissipate the heat generated in the channel layer 126, but also realize the dissipation of the heat in the plurality of heat-dissipation fin structures. Therefore, the interconnection structure 160 may be able to improve the heat-dissipation ability of the plurality of heat-dissipation fin structures 122, and thus improve the performance of the semiconductor structure.

In one embodiment, the interconnection structure 160 may include a plug electrically connected to the source/drain doped region, and a connection wire connected to the plug. The plug and the connection wire may be made of one or more of metal materials, such as W, Al, Cu, etc. The interconnection structure 160 may be formed through any appropriate process according to existing technology.

Figure 11:
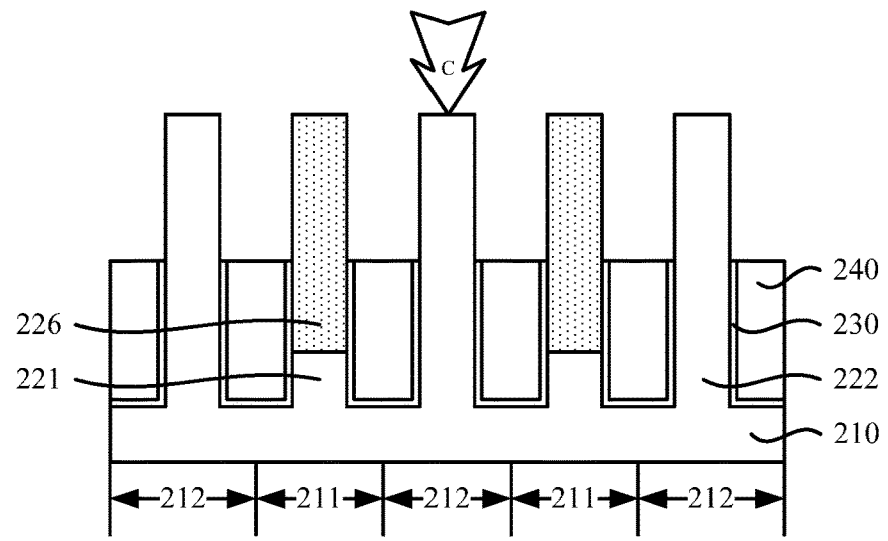
FIGS. 11-12 illustrate schematic views of semiconductor structures at certain stages of another exemplary method for fabricating a semiconductor structure consistent with some embodiments of the present disclosure.
Figure 12:
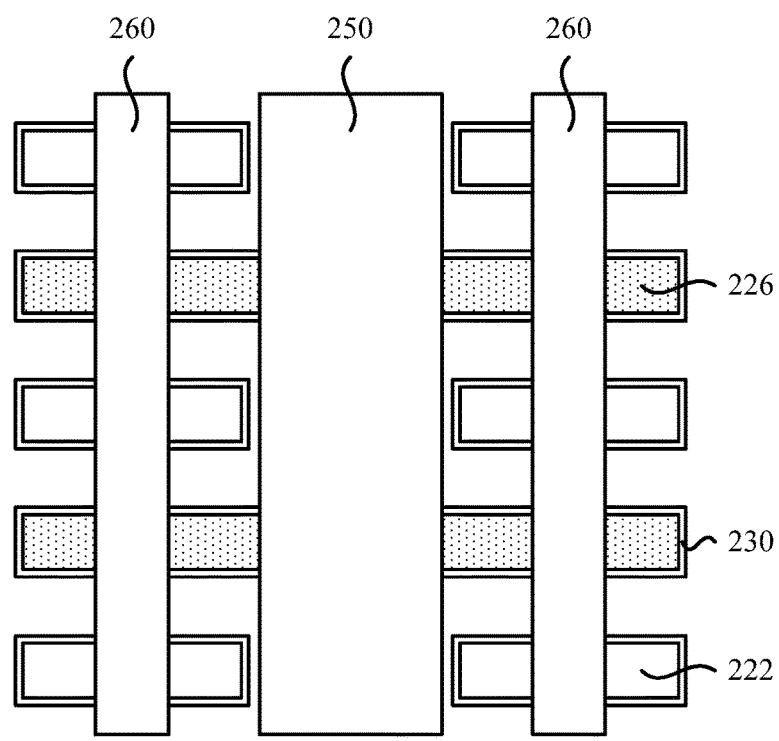

The present disclosure also provides another method for fabricating a semiconductor structure. FIGS. 11-12 illustrate schematic views of semiconductor structures at certain stages of the exemplary method.

Referring to FIG. 11, a substrate 210 including a plurality of function regions 211 and a plurality of heat-dissipation regions 212 may be provided. The plurality of function regions 211 and the plurality of heat-dissipation regions 212 may be arranged alternately in a direction perpendicular to the length direction of the active fin structures 211. A plurality of active fin structures 221 may be formed on the substrate 210 of the function regions 211, a plurality of heat-dissipation fin structures 222 may be formed on the substrate 210 of the heat-dissipation regions 212. Further, a linear oxide layer 230, an isolation layer 240, and a plurality of channel layers 226 may be formed. The processes for forming the linear oxide layer 230, the isolation layer 240, and the plurality of channel layers 226 may be substantially the same or similar to the corresponding processes described in the above embodiments, and thus the detailed description of the fabrication processes may be referred to the illustration provided above.

For illustrative purposes, referring to FIG. 11, the semiconductor structure is described to include three heat-dissipation regions 212 and two function regions 211. In one embodiment, each function region 211 may separate two adjacent heat-dissipation regions 212 such that the area of the heat-dissipation regions may be improved, and thus the heat-dissipation ability and the electrical performance of the semiconductor structure may be improved.

Further, a plurality of gate structures may be formed across the plurality of channel layers to cover a portion of the top and sidewall surfaces of each channel layer, an interconnection structure may be formed on the channel layers on each side of the gate structures. FIG. 12 illustrates a schematic top view of a semiconductor structure consistent with some embodiments of the present disclosure. Specifically, FIG. 12 illustrates the top view of the semiconductor structure in a C direction shown in FIG. 11. For illustrative purposes, the substrate 210 and the isolation layer 240 are not included in the top view shown in FIG. 12.

Referring to FIG. 12, a plurality of gate structures 250 may be formed across the plurality of channel layers 226 to cover a portion of the top and sidewall surfaces of each channel layer 226, an interconnection structure 260 may be formed on the channel layers 226 on each side of the gate structures 250. The processes for forming the gate structure 250 and the interconnection structure 260 may be substantially the same or similar to the corresponding processes described in the above embodiments, and thus the detailed description of the fabrication processes may be referred to the illustration provided above.

Referring to FIGS. 11-12, in one embodiment, each heat-dissipation region 212 may include one heat-dissipation fin structure 222, and each function region 111 may include one active fin structure 211 and one channel layer 226 formed on the top of the one active fin structure 211. Therefore, in the direction perpendicular to the extending direction of the active fin structures 211, the heat-dissipation fin structures 222 and the active fin structures 211 may be alternately arranged. Therefore, the heat generated in each channel layer 226 may be dissipated from both sides, which may be conducive to improving the heat-dissipation ability and the electrical performance of the formed semiconductor structure.

Moreover, in one embodiment, the semiconductor structure to be formed may be a PMOS transistor device, and accordingly, the channel layers 226 may be made of SiGe to improve the mobility of carriers in the channel of the formed semiconductor structure. As such, the properties of the channel as well as the performance of the semiconductor structure may be improved.

The present disclosure also provides a semiconductor structure. FIGS. 9-10 illustrate schematic views of a semiconductor structure consistent with some embodiments of the present disclosure.

Referring to FIGS. 9-10, the semiconductor structure may include a substrate 110. The substrate 110 may include a function region 111 and a plurality of heat-dissipation regions 112 adjacent to the function region 111. The semiconductor structure may also include a plurality of active fin structures 121 protruding from the substrate 110 of the function region 111, a plurality of channel layers 126 formed on the plurality of active fin structures 121, and a plurality of heat-dissipation fin structures 122 protruding from the substrate 110 of the plurality of heat-dissipation regions 112.

The substrate 110 may provide mechanic support for the semiconductor structure.

A plurality of transistors may be formed on the substrate 110 of the function region 111 to realize the electrical performance of the semiconductor structure. The plurality of heat-dissipation fin structures 122 formed on the substrate 110 of the plurality of heat-dissipation regions 112 may improve the heat-dissipation ability of the semiconductor structure. As such, the performance of the semiconductor structure may be improved.

The substrate 110 of the function region 111 and the substrate 110 of the plurality of heat-dissipation regions 112 may be connected to each other. As such, when the plurality of semiconductor structures formed on the substrate 110 of the function region 111 operate, the heat generated in the function region 111 may be transferred from the substrate 110 of the function region 111 to the substrate of the plurality of heat-dissipation regions 112, and thus may be dissipated.

In one embodiment, the number of the heat-dissipation regions 112 may be more than one, and the heat-dissipation regions 112 may be disposed on the two sides of the function region 111. Therefore, the heat generated in the function region 111 may be dissipated through the heat-dissipation regions 112. As such, the heat-dissipation ability of the semiconductor structure may be improved.

In one embodiment, the substrate 110 may be made of Si. The thermal conductivity of Si is large. In particular, the Si—Si bond structures in single-crystalline Si are strong covalent bond structures that have high efficiency in conducting particle vibrations. Therefore, the thermal conductivity of single-crystalline Si is high. Using Si as the material of the substrate 110 may be able to effectively improve the heat conduction result of the substrate 110, and thus may be conducive to improving the result of heat dissipation. As such, the performance of the semiconductor structure may be improved.

In other embodiments, the substrate may be made of polycrystalline silicon, amorphous silicon, germanium, GaAs, SiGe, or any other appropriate semiconductor material. Alternatively, the substrate may be a structure including an epitaxial layer or may be made of silicon on insulator. The substrate may be made of a semiconductor material having high thermal conductivity.

The plurality of active fin structures 121 may be able to provide support for the plurality of channel layers 126, and may also be able to conduct the heat generated by the plurality of semiconductor structures formed on the active fin structures 121. The plurality of heat-dissipation fin structures 122 may be able to dissipate the heat conducted through the substrate 110 of the heat-dissipation regions 112.

The plurality of active fin structures 121 may be connected to the plurality of channel layers 126. When the semiconductor structure operates, the active fin structures 121 may be able to conduct the heat generated in the channel layers. In one embodiment, the plurality of active fin structures 121 may also be connected to the substrate 110 of the function region 111 such that the heat generated in the channel layers 126 may be conducted to the substrate 110 of the function region 111, and then to the substrate 110 of the heat-dissipation regions 112. Further, the plurality of heat-dissipation fin structures 122 may be connected to the substrate 110 of the heat-dissipation regions 112, and thus may be able to conduct the heat in the substrate 110 of the heat-dissipation regions 112 to realize heat dissipation. Therefore, the formation of the plurality of heat-dissipation fin structures 122 may be able to effectively improve the dissipation of the heat generated in the channel layers 126, and thus may be conducive to improving the performance of the semiconductor structure.

Referring to FIG. 10, in the length direction of the plurality of active fin structures 121, the heat-dissipation regions 112 may be disposed on at least one side of the function region 111. In addition, the plurality of heat-dissipation fin structures 122 may be arranged in parallel to the plurality of active fin structures 121. That is, the length direction of the heat-dissipation fin structures 122 may be parallel to the length direction of the active fin structures 121. By arranging the plurality of heat-dissipation fin structures 122 in parallel to the plurality of active fin structures 121, the process difficulty for forming the plurality of heat-dissipation fin structures 122 and the plurality of active fin structures 121 may be reduced. Therefore, undesired effects in the fabrication process may be effectively reduced, and thus the performance may be improved and the production yield may also be improved.

In one embodiment, the distance L between a heat-dissipation fin structure 122 and an adjacent active fin structure 121 may be in a range of approximately 40 nm to 90 nm. That is, at the boundary between the function region 111 and the adjacent heat-dissipation region 112, the distance between the heat-dissipation fin structure 122 close to the function region 111 and the active fin structure close to the heat-dissipation region 112 may be in a range of approximately 40 nm to 90 nm.

At the boundary between the function region 111 and the adjacent heat-dissipation region 112, the distance L between a heat-dissipation fin structure 122 and an adjacent active fin structure 121 may not be too large or too small. When the distance L between the heat-dissipation fin structure 122 and the adjacent active fin structure 121 is too large, the heat conduction to the heat-dissipation fin structure 122 may be affected, which may not be conducive to heat dissipation. In addition, a large distance L between the heat-dissipation fin structure 122 and the adjacent active fin structure 121 may also increase the wafer area that is occupied by the semiconductor structure, which may not be conducive to improving the integration level. When the distance L between the heat-dissipation fin structure 122 and the adjacent active fin structure 121 is too small, the small distance between the heat-dissipation fin structure 122 and the active fin structure may not be conducive to the dissipation of heat at the active fin structure 121, and thus may not be conducive to improving the performance of the semiconductor structure.

In one embodiment, two active fin structures 121 are formed on the substrate 110 of the function region 111, and the two active fin structures 121 are parallel to each other. In addition, the semiconductor structure includes two heat-dissipation regions 112, and in a direction perpendicular to the length direction of the active fin structures 121, the two heat-dissipation regions 112 are located at the two sides of the function region 111, respectively. Further, a heat-dissipation fin structure 122 is formed on the substrate 110 of each heat-dissipation region 112.

In other embodiments, the number of the heat-dissipation fin structures formed on each heat-dissipation region may be more than one, and the heat-dissipation fin structures may be parallel to each other. The distance between adjacent heat-dissipation fin structures may be in a range of approximately 30 nm to 100 nm.

The distance between adjacent heat-dissipation fin structures 122 may not be too large or too small. When the distance between adjacent heat-dissipation fin structures 122 is too large, an increase in the area of the heat-dissipation region 112 may not be avoided, and thus, the wafer area that is occupied by the semiconductor structure may be too large. As such, the integration level of the semiconductor structure may be affected. When the distance between adjacent heat-dissipation fin structures 122 is too small, the dissipation of the heat at the heat-dissipation fin structures 122 may be affected, which may not be conducive to improving the heat dissipation effect of the heat-dissipation fin structures 122. Therefore, the performance of the semiconductor structure may not be improved.

In other embodiments, the number of the heat-dissipation fin structures 122 may be smaller than or equal to the number of the active fin structures 121 such that the wafer area that is occupied by the heat-dissipation fin structures 122 may be reduced. Therefore, the area of the heat-dissipation region may be reduced, and the area occupied by the semiconductor structure may be limited, such that the integration level may be improved.

In one embodiment, the active fin structures 121 and the heat-dissipation fin structures 122 may be made of a material the same as the material of the substrate 110. For example, the active fin structures 121, the heat-dissipation fin structures 122, and the substrate 110 may all be made of Si. The thermal conductivity of Si is high, and using Si for forming the active fin structures 121 and the heat-dissipation fin structures 122 may be able to effectively improve the conduction of heat, and thus may be conducive to improving the heat dissipation result. As such, the performance of the semiconductor structure may be improved.

In one embodiment, the active fin structures 121, the heat-dissipation fin structures 122, and the substrate 110 may together form a single-piece structure. That is, there is no clearly-defined boundary separating the active fin structures 121, the heat-dissipation fin structures 122, and the substrate 110. Without any obvious boundary separating the active fin structures 121, the heat-dissipation fin structures 122, and the substrate 110, the efficiency for heat transfer from the active fin structures 121 to the heat-dissipation fin structures 122 through the substrate 110 may be effectively improved. Therefore, the heat-dissipation ability may be effectively improved and the performance of the semiconductor structure may also be improved.

In one embodiment, the semiconductor structure may also include a linear oxide layer 130 covering the surfaces of substrate 110, the active fin structures 121, and the heat-dissipation fin structures 122. The linear oxide layer 130 may be able to repair the surface damage of the substrate 110, the active fin structures 121, and the heat-dissipation fin structures 122. In addition, the linear oxide layer 130 may also be able to smooth the sharp corners at the surfaces of the substrate 110, the active fin structures 121, and the heat-dissipation fin structures 122, and may also serve as a buffer layer between subsequently-formed film layers and the substrate 110, the active fin structures 121, and the heat-dissipation fin structures 122 to reduce lattice mismatch.

In one embodiment, the channels of the semiconductor structure may be located in the plurality of channel layers 126. When the semiconductor structure is an NMOS transistor device, the plurality of channel layers 126 may be made of a Group III-V semiconductor. For example, the plurality of channel layers 126 may be made of InGaAs or InAs. In other embodiments, the semiconductor structure to be formed may be a PMOS transistor device, and thus, the plurality of channel layers may be made of SiGe.

Using a Group III-V semiconductor to form the plurality of channel layers 126 may be able to effectively improve the properties of the channels, and thus may be conducive to improving the performance of the semiconductor structure. In addition, because the plurality of channel layers 126 are formed on the active fin structure 121, when the semiconductor structure operates, the heat generated in the plurality of channel layers 126 may be transferred to the substrate 110 through the active fin structure 121, and may thus be transferred to the plurality of heat-dissipation fin structures 122 through the substrate 110. As such, the heat generated in the channel layers 126 may be dissipated. Therefore, the plurality of heat-dissipation fin structures 122 and the connected substrate 110 may be able to effectively improve the heat-dissipation ability of the channel layers 126, which may benefit both the channel performance and the heat dissipation capability, and thus may be conducive to improving the performance of the semiconductor structure.

In one embodiment, the semiconductor structure may further include a plurality of gate structures 150 formed across the plurality of channel layers 126 and covering a portion of the top and the sidewall surfaces of each channel layer 126. Each gate structure 150 may be a gate structure of the semiconductor structure and may be used to control turning on or turning off the channel of the gate structure.

In one embodiment, the gate structure 150 may be formed across the channel layers 126 and may cover a portion of the top and the sidewall surfaces of each channel layer 126. The gate structure 150 may be a polycrystalline silicon gate structure. In other embodiments, the gate structure may be a metal gate structure.

In one embodiment, the semiconductor structure may include a plurality of trenches 124 formed in each heat-dissipation fin structure 122. The plurality of trenches 124 may divide the heat-dissipation fin structure 122 into multiple heat-dissipation sections (not labeled) lined up in the length direction of the heat-dissipation fin structure 122. Each gate structure 150 may extend into the plurality of trenches 124 and may intersect with the plurality of heat-dissipation fin structures 122 at the plurality of trenches 124.

The plurality of trenches 124 may provide a process space for the plurality of gate structures 150. As such, in the extending direction of the gate structures 150, the plurality of gate structures 150 may intersect with the plurality of heat-dissipation fin structures 122 at the plurality of gate structures 150. In addition, forming a plurality of channels in the heat-dissipation fin structures 122 by the gate structures 150 may be avoided, which may reduce the influence of the heat-dissipation fin structures 122 on the semiconductor structure.

In one embodiment, the extending direction of each gate structure 150 may be perpendicular to the channel layers 126, and the gate structure 150 may intersect with the plurality of heat-dissipation fin structures 122. However, the intersections between the gate structure 150 and the plurality of heat-dissipation fin structure 122 may correspond to the positions of the plurality of trenches 124. That is, the gate structure 150 may extend into the plurality of trenches 124, and may intersect with the plurality of heat-dissipation fin structures 122 at the plurality of trenches 124. Accordingly, when the semiconductor structure operates, because the heat-dissipation fin structures 122 do not include any channel, the influence of the heat-dissipation fin structures 122 on the electrical performance of the semiconductor structure may be prevented.

Further, in one embodiment, the semiconductor structure may also include an isolation layer 140 filling up the space between the plurality of active fin structures 121, the plurality of heat-dissipation fin structures 122, and the plurality of channel layers 126. The isolation layer 140 may be used to electrically isolate the plurality of active fin structures 121, the plurality of heat-dissipation fin structures 122, and the plurality of channel layers 126.

In one embodiment, the isolation layer 140 may be made of $SiO_x$. In other embodiments, the isolation layer may be made of one or more of $SiN_x$, SiON, a low-k dielectric material (i.e., a material with a dielectric constant larger than or equal to 2.5, but smaller than 3.9), and an ultra-low-k dielectric material (i.e., a material with a dielectric constant smaller than 2.5).

In one embodiment, the isolation layer 140 may expose a portion of the sidewall surfaces of each channel layer 126 such that the plurality of gate structures 150 may be able to cover a portion of the sidewall surfaces of the channel layer 126. In addition, because the isolation layer 140 is formed between the plurality of active fin structures 121, the plurality of heat-dissipation fin structures 122, and the plurality of channel layers 126, and the top surfaces of the heat-dissipation fin structures 122 are leveled with the top surface of the channel layers 126, the isolation layer 140 may not only expose the portion of the sidewall surfaces of the channel layer 126, but also expose the sidewall surfaces of the heat-dissipation fin structures 122.

Moreover, in one embodiment, the semiconductor structure may also include a source/drain doped region (not shown) formed in each channel layer 126 on both sides of the gate structure 150, and a dummy doped region (not shown) formed in each heat-dissipation section 125 on both sides of the trench 124. In addition, the semiconductor structure may further include an interconnection structure 160 formed on the plurality of channel layers 126 on each side of the gate structures 150. The interconnection structure 160 may extend to cover a portion of the top surfaces of the heat-dissipation sections 125.

In one embodiment, the interconnection structure 160 may be formed on the top of the source/drain doped region, and may be electrically connected to the source/drain doped region. As such, the interconnection structure 160 may be able to electrically connect the source/drain doped region to external circuits. The interconnection structure 160 may be made of a conductive material, e.g. a metal. Therefore, the thermal conductivity of the material of the interconnection structure 160 may be large. As such, the interconnection structure 160 formed on the channel layers 126 on each side of the gate structures may be able to conduct heat such that the heat dissipation ability of the semiconductor structure may be improved.

As shown in FIG. 10, the extending direction of the interconnection structure 160 may be perpendicular to the length direction of the active fin structures 121 and the channel layers 126. In addition, the interconnection structure 160 may extend to cover a portion of the top surfaces of the heat-dissipation sections 125. The interconnection structure 160 may not only directly dissipate the heat generated in the channel layer 126, but also realize the dissipation of the heat in the plurality of heat-dissipation fin structures. Therefore, the interconnection structure 160 may be able to improve the heat-dissipation ability of the plurality of heat-dissipation fin structures 122, and thus improve the performance of the semiconductor structure.

In one embodiment, the interconnection structure 160 may include a plug electrically connected to the source/drain doped region, and a connection wire connected to the plug. The plug and the connection wire may be made of one or more of metal materials, such as W, Al, Cu, etc.

Further, the present disclosure also provides another semiconductor structure. FIG. 11 illustrates a cross-section view of the semiconductor structure consistent with some embodiments of the present disclosure.

Referring to FIG. 11, the semiconductor structure may include a substrate 210 including a plurality of function regions 211 and a plurality of heat-dissipation regions 212. The plurality of function regions 211 and the plurality of heat-dissipation regions 212 may be arranged alternately in a direction perpendicular to the length direction of the active fin structures 211. A plurality of active fin structures 221 may be formed on the substrate 210 of the function regions 211, a plurality of heat-dissipation fin structures 222 may be formed on the substrate 210 of the heat-dissipation regions 212. Further, the semiconductor structure may include a linear oxide layer 230, an isolation layer 240, and a plurality of channel layers 226. The linear oxide layer 230, the isolation layer 240, and the plurality of channel layers 226 may be substantially the same or similar to the corresponding components in the semiconductor structure described in the above embodiments, and thus the detailed description of the semiconductor structure may be referred to the illustration provided above.

For illustrative purposes, referring to FIG. 11, the semiconductor structure is described to include three heat-dissipation regions 212 and two function regions 211. In one embodiment, each function region 211 may separate two adjacent heat-dissipation regions 212 such that the area of the heat-dissipation regions may be improved, and thus the heat-dissipation ability and the electrical performance of the semiconductor structure may be improved.

In one embodiment, the semiconductor structure may also include a plurality of gate structures formed across the plurality of channel layers to cover a portion of the top and sidewall surfaces of each channel layer, and an interconnection structure formed on the channel layers on each side of the gate structures. FIG. 12 illustrates a schematic top view of the semiconductor structure in a C direction shown in FIG. 11. For illustrative purposes, the substrate 210 and the isolation layer 240 are not included in the top view shown in FIG. 12.

Referring to FIG. 12, the semiconductor structure may include a plurality of gate structures 250 formed across the plurality of channel layers 226 to cover a portion of the top and sidewall surfaces of each channel layer 226, and an interconnection structure 260 formed on the channel layers 226 on each side of the gate structures 250. The gate structure 250 and the interconnection structure 260 may be substantially the same or similar to the corresponding components in the semiconductor structure described in the above embodiments, and thus the detailed description of the semiconductor structure may be referred to the illustration provided above.

Referring to FIGS. 11-12, in one embodiment, each heat-dissipation region 212 may include one heat-dissipation fin structure 222, and each function region 111 may include one active fin structure 211. The function region 111 may also include a channel layer 226 formed on the top of the active fin structure 211. Therefore, in the direction perpendicular to the length direction of the active fin structures 211, the heat-dissipation fin structures 222 and the active fin structures 211 may be alternately arranged. As such, the heat generated in each channel layer 226 may be dissipated from both sides, which may be conducive to improving the heat-dissipation ability and the electrical performance of the semiconductor structure.

Moreover, in one embodiment, the semiconductor structure may be a PMOS transistor device, and accordingly, the channel layers 226 may be made of SiGe to improve the mobility of carriers in the channel of the semiconductor structure. As such, the properties of the channel as well as the performance of the semiconductor structure may be improved.

Therefore, the formation of the plurality of heat-dissipation fin structures may effectively improve the dissipation of the heat generated in the channel layers. As such, the heat-dissipation ability of the channel layers may be improved, and the performance of the semiconductor structure may also be improved.

Compared to conventional semiconductor structures and fabrication methods, the disclosed semiconductor structures and fabrication methods may demonstrate the following advantages.

According to the disclosed semiconductor structures and fabrication methods, a plurality of heat-dissipation fin structures are formed on the substrate of a plurality of heat-dissipation regions adjacent to the function region. The substrate of the function region is connected to the substrate of the plurality of heat-dissipation regions. Therefore, the heat generated in the channel layers may be transferred to the plurality of heat-dissipation fin structures through the substrate that is connected to the active fin structures, and may thus be dissipated. As such, the formation of the plurality of heat-dissipation fin structures may effectively improve the heat-dissipation ability of the channel layers, which may further be conducive to improving the performance of the formed semiconductor structure.

According to the disclosed semiconductor structures and fabrication methods, the semiconductor structure may include a function region and a plurality of heat-dissipation regions disposed on the two sides of the function region. Alternately, the semiconductor structure may include a plurality of alternately-arranged heat-dissipation regions and function regions. By arranging the heat-dissipation regions on the two sides of a function region or by alternately arranging the heat-dissipation regions and the function regions, the heat-transfer efficiency may be effectively improved. As such, the heat dissipation of the heat-dissipation fin structures and the performance of the semiconductor structure may be improved.

According to the disclosed semiconductor structures and fabrication methods, a plurality of trenches may be formed in each heat-dissipation fin structure. The plurality of trenches may divide the heat-dissipation fin structure into multiple heat-dissipation sections in the length direction of the heat-dissipation fin structure. The plurality of gate structures may extend into the trenches and may intersect with the plurality of heat-dissipation fin structures at the plurality of trenches. Because the gate structures intersect with the plurality of heat-dissipation fin structures at the plurality of trenches, the gate structures may not form any channel in the heat-dissipation fin structures. Therefore, the formation of the plurality of trenches may be able to effectively reduce the influence of the heat-dissipation fin structures on the electrical performance of the semiconductor structure, and thus may be conducive to improving the stability and the reliability of the formed semiconductor structure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
    a substrate, including a plurality of function regions and a plurality of heat-dissipation regions, wherein each heat-dissipation region is adjacent to at least one function region;
    a plurality of active fin structures, protruding from the substrate of the plurality of function regions;
    a plurality of channel layers, each formed on an active fin structure; and
    a plurality of heat-dissipation fin structures, protruding from the substrate of the plurality of heat-dissipation regions;
    a plurality of trenches formed in each of the plurality of heat-dissipation fin structures.

2. The semiconductor structure according to claim 1, wherein:
    the plurality of heat-dissipation regions are arranged on both sides of the plurality of function regions; or
    the plurality of heat-dissipation regions and the plurality of function regions are alternately arranged.

3. The semiconductor structure according to claim 1, wherein:
    the substrate, the plurality of active fin structures, and the plurality of heat-dissipation fin structures together form a single-piece structure.

4. The semiconductor structure according to claim 3, wherein:
    the substrate, the plurality of active fin structures, and the plurality of heat-dissipation fin structures are made of Si.

5. The semiconductor structure according to claim 1, wherein:
    a number of the plurality of heat-dissipation fin structures is smaller than or equal to a number of the plurality of active fin structures.

6. The semiconductor structure according to claim 1, wherein:
    the plurality of heat-dissipation fin structures are arranged parallel to each other; and
    a distance between adjacent heat-dissipation fin structures is in a range of approximately 30 nm to 100 nm.

7. The semiconductor structure according to claim 1, wherein:
    in a direction perpendicular to a length direction of the plurality of active fin structures, the plurality of heat-dissipation regions are arranged on at least one side of each function region; and
    the plurality of heat-dissipation fin structures are parallel to the plurality of active fin structures.

8. The semiconductor structure according to claim 7, wherein:
    a distance from a heat-dissipation fin structure to an active fin structure adjacent to the heat-dissipation fin structure is in a range of approximately 40 nm to 90 nm.

9. The semiconductor structure according to claim 1, wherein:
    the semiconductor structure is a P-type metal-oxide-semiconductor transistor (PMOS) device; and
    the plurality of channel layers are made of SiGe.

10. The semiconductor structure according to claim 1, wherein:
the semiconductor structure is an N-type metal-oxide-semiconductor transistor (NMOS) device; and
the plurality of channel layers are made of a Group III-V semiconductor material.

11. The semiconductor structure according to claim 10, wherein:
the plurality of channel layers are made of InGaAs or InAs.

12. A semiconductor structure, comprising:
a substrate, including a plurality of function regions and a plurality of heat-dissipation regions, wherein each heat-dissipation region is adjacent to at least one function region;
a plurality of active fin structures, protruding from the substrate of the plurality of function regions;
a plurality of channel layers, each formed on an active fin structure;
a plurality of heat-dissipation fin structures, protruding from the substrate of the plurality of heat-dissipation regions; and
a plurality of trenches formed in each heat-dissipation fin structure, wherein:
in a direction perpendicular to a length direction of the plurality of active fin structures, the plurality of heat-dissipation regions are arranged on at least one side of each function region,
the plurality of heat-dissipation fin structures are parallel to the plurality of active fin structures, and
the plurality of trenches divide the heat-dissipation fin structure into multiple heat-dissipation sections arranged in a length direction of the heat-dissipation fin structure.

13. The semiconductor structure according to claim 12, further including:
a plurality of gate structures, formed across the plurality of channel layers and covering a portion of top and sidewall surfaces of the plurality of channel layers, wherein:
the plurality of gate structures extend to the plurality of trenches, and intersect with the plurality of heat-dissipation fin structures at the plurality of trenches.

14. The semiconductor structure according to claim 13, further including:
an interconnection structure, formed on the plurality of channel layers on each side of the plurality of gate structures, wherein:
the interconnection structure extends to cover a portion of top surfaces of the heat-dissipation sections.

15. A method for fabricating a semiconductor structure, comprising:
providing a substrate, including a plurality of function regions and a plurality of heat-dissipation regions, wherein each heat-dissipation region is adjacent to at least one function region;
forming a plurality of active fin structures protruding from the substrate of the plurality of function regions, and a plurality of heat-dissipation fin structures protruding from the substrate of the plurality of heat-dissipation regions;
forming a plurality of trenches in each of the plurality of heat-dissipation fin structures;
forming a dielectric layer on the substrate, wherein the dielectric layer exposes the plurality of the active fin structures; and
removing a portion of each active fin structure to form a plurality of fin-structure openings in the dielectric layer; and
forming a plurality of channel layers in the plurality of fin-structure openings on top of a remaining portion of the plurality of active fin structures.

16. The method according to claim 15, wherein forming the plurality of active fin structures and the plurality of heat-dissipation fin structures includes:
forming a fin structure material layer on the substrate;
forming a fin-structure mask layer on the fin-structure material layer, wherein the fin-structure mask layer defines positions and dimensions of the plurality of active fin structures and the plurality of heat-dissipation fin structures; and
forming the plurality of active fin structures protruding from the substrate of the plurality of function regions and the plurality of heat-dissipation fin structures protruding from the substrate of the plurality of heat-dissipation regions by etching the fin-structure material layer using the fin-structure mask layer as an etch mask.

17. The method according to claim 16, wherein:
forming the plurality of trenches in each heat-dissipation fin structure is after forming the plurality of active fin structures and the plurality of heat-dissipation fin structures and prior to forming the dielectric layer, and wherein:
the plurality of trenches divide the heat-dissipation fin structure into multiple heat-dissipation sections arranged in a length direction of the heat-dissipation fin structure.

18. The method according to claim 17, after forming the plurality of channel layers, further including:
removing a portion of the dielectric layer to expose a portion of sidewall surfaces of the plurality of channel layers; and
forming a plurality of gate structures across the plurality of channel layers to cover a portion of top and sidewall surfaces of the plurality of channel layers, wherein:
the plurality of gate structures extend to the plurality of trenches, and intersect with the plurality of heat-dissipation fin structures at the plurality of trenches.

19. The method according to claim 18, after forming the plurality of gate structures, further including:
forming an interconnection structure on the plurality of channel layers on each side of the plurality of gate structures, wherein:
the interconnection structure extends to cover a portion of top surfaces of the heat-dissipation sections.

20. The method according to claim 15, wherein:
the plurality of channel layers are formed in the plurality of fin-structure openings through epitaxial growth.

* * * * *